(12) United States Patent
Henkel

(10) Patent No.: US 9,310,415 B2
(45) Date of Patent: Apr. 12, 2016

(54) TEST SYSTEM FOR PLUG-IN CONNECTORS, AIRCRAFT OR SPACECRAFT AND METHOD

(71) Applicant: Airbus Operations GmbH, Hamburg (DE)

(72) Inventor: Wolfram Henkel, Rosengarten (DE)

(73) Assignee: AIRBUS OPERATIONS GmbH, Hamburg (DE)

( * ) Notice: Subject to any disclaimer, the term of this patent is extended or adjusted under 35 U.S.C. 154(b) by 364 days.

(21) Appl. No.: 13/735,485

(22) Filed: Jan. 7, 2013

(65) Prior Publication Data

US 2013/0187661 A1      Jul. 25, 2013

Related U.S. Application Data

(60) Provisional application No. 61/583,204, filed on Jan. 5, 2012.

(30) Foreign Application Priority Data

Jan. 5, 2012   (DE) .......................... 10 2012 200 115

(51) Int. Cl.
*G01R 31/00*     (2006.01)
*G01R 31/04*     (2006.01)

(52) U.S. Cl.
CPC .............. *G01R 31/04* (2013.01); *G01R 31/045* (2013.01)

(58) Field of Classification Search
CPC .... G01R 31/04; G01R 31/045; H01R 9/2483; G01N 30/7233
USPC .................................................. 324/500, 503
See application file for complete search history.

(56) References Cited

U.S. PATENT DOCUMENTS

| | | | |
|---|---|---|---|
| 4,218,745 A | | 8/1980 | Perkins |
| 5,237,264 A | * | 8/1993 | Moseley et al. ............... 323/324 |
| 2006/0043976 A1 | | 3/2006 | Gervais |
| 2010/0262391 A1 | | 10/2010 | Sauermann |
| 2011/0001659 A1 | * | 1/2011 | Hampel et al. ................ 342/120 |

FOREIGN PATENT DOCUMENTS

DE   102008043491   5/2010

* cited by examiner

*Primary Examiner* — Melissa Koval
*Assistant Examiner* — Trung Nguyen
(74) *Attorney, Agent, or Firm* — Greer, Burns & Crain, Ltd.

(57) ABSTRACT

A test system for plug-in connectors, especially for plug-in connectors in an airplane. A transmitting device which is designed for sending out a test signal to the plug-in connectors to be tested, and comprising at least one receiving device for each plug-in connector to be tested which is electrically coupled with the respective plug-in connector and which is designed for receiving the transmitted test signal and outputting an acknowledgement signal in response to receiving the transmitted test signal. Furthermore, the present invention creates an aircraft or a spacecraft and a method.

15 Claims, 5 Drawing Sheets

TEST SYSTEM FOR PLUG-IN CONNECTORS, AIRCRAFT OR SPACECRAFT AND METHOD

CROSS REFERENCE TO RELATED APPLICATIONS

This application claims benefit of U.S. provisional application No. 61/583,204, filed Jan. 5, 2012 and German patent application No. 10 2012 200 115.8, filed Jan. 5, 2012, the entire disclosures of which are herein incorporated by reference.

FIELD OF THE INVENTION

The present invention relates to a test system for plug-in connectors, especially for plug-in connectors in an airplane, an aircraft or spacecraft, and to a method.

BACKGROUND OF THE INVENTION

Although it is applicable to any plug-in connectors, the present invention and the problems forming its basis will be explained in greater detail with reference to plug-in connectors in an airplane.

In current airplanes, especially in current wide-bodied airplanes, a multiplicity of electronic devices are installed. Such electronic devices can be, for example, components of the aircraft cabin systems such as, e.g. the announcement system, the seating electronics or also components of infotainment systems such as, e.g., video screens or loudspeakers in the aircraft cabin.

In order to be able to operate this plurality of electronic devices in an airplane, it is necessary to supply these electronic devices with electrical energy. Some of the electronic devices must also be connected to other electronic devices for the purpose of data communication by means of data lines.

To connect the electronic devices to energy generators or energy sources and to communication partners, extensive aircraft cabling systems are used.

Such an aircraft cabling system usually consists of a plurality of individual electrical cables and plug-in connectors. In particular, the individual electrical cables have plug-in connectors at their ends in order to be able to contact the individual electronic devices.

However, an aircraft cabling system also has within the cabling system a plurality of plug-in connectors which connect individual segments of the aircraft cabling system with one another. This makes it possible, for example, to install an aircraft cabling system segment by segment already during the production of individual aircraft segments and when joining the individual aircraft segments to complete the cabling by connecting the individual segments of the cabling system. This prevents having to delay the installation of the aircraft cabling system until the aircraft fuselage is assembled completely.

In case of a fault, defective plug-in connections may have to be located. For this purpose, the plug-in connections are usually detached and the individual plugs are checked and measured out.

WO2011096970 A1 shows, for example, a device and a method for testing cables.

In consequence, using a plurality of plug-in connectors in the aircraft cabling system leads to a very high expenditure for fault finding in the aircraft cabling system.

This is a state which should be avoided.

SUMMARY OF THE INVENTION

It is the object of the present invention, therefore, to provide a simple capability for testing plug-in connectors.

According to the invention, this object is achieved by a test system having the features of Patent claim 1, an aircraft or a spacecraft having the features of Patent claim 10 and a method having the features of Patent claim 11.

Accordingly, there is provided:

A test system for plug-in connectors, especially for plug-in connectors in an airplane, comprising a transmitting device which is designed for sending out at least one predetermined test signal for the plug-in connectors to be tested, at least one receiving device for each plug-in connector to be tested which is electrically coupled with the respective plug-in connector and which is designed for receiving the transmitted test signal and outputting at least one predetermined acknowledgement signal in response to receiving the transmitted test signal.

An aircraft or spacecraft, comprising an aircraft cabling system which has at least one plug-in connector and comprising a test system according to the invention.

A test method for plug-in connectors, especially for plug-in connectors in an airplane and especially by means of a test system according to the invention, comprising the steps of sending out a predetermined test signal by means of a transmitting device which is coupled with a plug-in connector to be tested via an electrical cable, and outputting a predetermined acknowledgement signal in response to receiving the test signal at a receiving device by the respective receiving device, wherein the receiving device is electrically coupled with the plug-in connector to be tested. Wherein electrically coupled means that the receiving device is coupled with the plug-in connector in an electrical, inductive, capacitive or similar manner.

The finding forming the basis of the present invention consists in that plug-in connectors can be tested using a simple signal transmission.

The concept forming the basis of the present invention then consists in taking this finding into account and providing a capability for transmitting a test signal to a plug-in connector and outputting an acknowledgement signal in response to a test signal received correctly at the plug-in connector.

The present invention makes it possible to check complex cabling systems having a plurality of plug-in connectors very rapidly and efficiently. If a test signal is sent by means of a transmitting device according to the invention to a plurality of receiving devices, the test signal can be received at the receiving devices. Thereupon, e.g. plug-in connectors coupled with a receiving device can be tested by means of a predetermined check such as e.g., by local measurements of the contact resistance. In this context, the transmitting device can send out a single test signal or send out a separate test signal for each individual receiving device. If a receiving device receives the single test signal or a test signal intended for this receiving device, the receiving device generates an acknowledgement signal which indicates, for example, that the receiving device has received the acknowledgement signal or that the corresponding plug-in connector is free of faults.

Due to the fact that complex cabling systems can be tested in a very simple manner, the time saving which can be achieved by the test system according to the invention during the testing of a cabling systems increase even further as the complexity of the cabling system increases.

Advantageous embodiments and developments are obtained from the subclaims and from the description, with reference to the figures.

In one embodiment, the transmitting device and/or the receiving device are supplied with electrical energy via the electrical cable. In this arrangement, the transmitting device and/or the receiving device can be supplied with electrical energy via the power supply lines existing in the electrical cable. In addition or as an alternative the transmitting device and/or the receiving device can be supplied with electrical energy via energy stores, e.g. Micro-Caps or batteries. For example, these batteries can be charged in a normal operation, e.g. of an aircraft. In a test mode of the aircraft in which the energy supply of the aircraft is switched off, the transmitting device and/or the receiving device can then be operated with the aid of the batteries. This enables plug-in connectors to be tested without having to run a separate power supply line for the individual receiving devices.

In one embodiment, the transmitting device is designed for sending the predetermined test signal to the plug-in connectors to be tested via the electrical cable. In addition or as an alternative, the receiving devices are designed for outputting the predetermined acknowledgement signal via the electrical cable. If the test signal is sent to the receiving devices via the electrical cable, it is possible to ensure by the reception of the predetermined test signal at a receiving device alone that the plugin connection to which the receiving device is allocated is free of electrical faults. Similarly, it is possible to determine by outputting the predetermined acknowledgement signal on the electrical cable that a plug-in connector is free of faults, if the predetermined acknowledgement signal is received.

In one embodiment, the transmitting device and/or the receiving device are supplied with electrical energy via a wireless interface. This makes it possible to operate the transmitting device and/or the receiving device without having to exert an influence on the data transmission or energy transmission on the electrical cable. If, for example, the electrical cable is a pure data cable, the transmitting device and/or the receiving device can be supplied only poorly with electrical energy via the electrical cable. Supplying the transmitting device and/or the receiving device with electrical energy could in this case corrupt the data which are transmitted on the electrical cable. If, in contrast, the transmitting device and/or the receiving device are supplied with electrical energy via a wireless interface, they can be operated without having any influence on the data transmission on the electrical cable.

In one embodiment, the transmitting device is designed for sending the predetermined signal to the plug-in connectors to be tested via the wireless interface. In addition or as an alternative, the receiving devices are designed for outputting the predetermined acknowledgement signal via the wireless interface. If the test signal is transmitted to the receiving devices via the wireless interface, the test signal can be received by all receiving devices which are located within range of the test signal to be transmitted by radio. This enables several branches of a cabling system to be tested simultaneously without having to attach a separate transmitting device at every branch of the cabling system or having to connect an individual transmitting device successively to the individual branches. This provides for rapid and simple checking of a plurality of plug-in connectors.

It also becomes possible to receive the acknowledgement signals of the individual receiving devices centrally. If both the test signal and the individual acknowledgement signals of the receiving devices are transmitted via the wireless interface, the receiving device can be designed for performing a predetermined checking of a respective plug-in connector, e.g. by local measurements of the contact resistance and outputting the result of this check coded in the acknowledgement signal.

In one embodiment, the transmitting device is coupled via the electrical cable with at least one plug-in connector to be tested and the receiving device is coupled with the respective plug-in connector in such a manner that the connecting elements of the respective plug-in connector are electrically arranged between the transmitting device and the receiving device. This ensures that in the case of a transmission of the test signal or of the acknowledgement signal, the contacts of the respective plug-in connector are located on the signal path. If one of the contacts is defective, the signal path is interrupted and the test signal or the acknowledgement signal cannot be transmitted or cannot be received in such a manner that the predetermined test signal or the predetermined acknowledgement signal is identifiable as such. This makes it possible to determine in a very simple manner whether the contacts of a plug-in connector are free of faults.

In another embodiment, both a plug and a socket of a plug-in connector have a receiving device. This enables the two receiving devices of a plug-in connector jointly to check the contacts of the corresponding plug-in connector after they have received a test signal via a radio link and thereupon output an acknowledgement signal also via a radio link.

In one embodiment the test signal sent and/or the acknowledgement signals have a frequency spectrum and/or a type of modulation which are designed in such a manner that a data transmission and/or power transmission via the electrical cable is not disturbed by the test signal sent and/or the acknowledgement signals. This enables plug-in connectors to be checked even when a data transmission or an energy transmission takes place on the electrical cable.

In one embodiment, the acknowledgement signals of the individual receiving devices have in each case a different frequency spectrum and/or a different modulation. This enables a plurality of acknowledgement signal to be transmitted simultaneously on an electrical cable or in a branch of a cabling system, e.g. of an airplane.

In a further embodiment, plug-in connectors are addressed directly and data for the plug-in connectors are transmitted by means of a digital data transmission. The range of the values for the addressing of PINs of a plug-in connector is alpha numeric, as a rule, comprises thus a range of integral numbers and the letters A to Z. The plug-in connector itself can be addressed by an unambiguous code which can be formed from the plug type, the plug manufacturer, the part number, the serial number, the sub plug (plug part) and the corresponding PIN. An example of such coding is given here:

| Manufacturer | Type | Part number | Serial number | Sub plug | Pin |
|---|---|---|---|---|---|
| ABCD1234 | 5678 | XYZ123456 | 98765 | A | 17 |

The address can be attached additionally in machine-readable form on the plug-in connector so that an input during installation and later addressing is easily possible. The address can also be transmitted wirelessly via RFID to e.g., the transmitting device. In every case, the installation location of the plug-in connector must be matched once with the address so that the defective plug-in connector can be located rapidly later in the case of a fault.

In another embodiment, the transmitting device simultaneously sends out a plurality of test signals, each test signal being intended for one receiving device. The individual test signals also have a different frequency spectrum and/or a different modulation in such a case.

In one embodiment, the acknowledgement signal can have, e.g. an identifier of the respective plug-in connector which makes it possible to log the plug-in connectors for which an acknowledgement signal has been received.

In one embodiment, an acknowledgement signal has a separate signal component for each contact of the corresponding plug-in connector, and thus for each line of the electrical cable. If a plug-in connector has, for example, two contacts, an acknowledgement signal can have two signal components with in each case a separate frequency, each signal component being used as acknowledgement signal for the respective contact of the plug-in connector.

In one embodiment, the acknowledgement signal is a digital signal and has digital data which characterize the condition of the respective plug-in connector or of the contacts of the plug-in connector, respectively.

The above embodiments and developments can be arbitrarily combined with one another if this is appropriate. Other possible embodiments, developments and implementations of the invention also comprise combinations not explicitly mentioned, of features of the invention described previously or in the text which follows with respect to the illustrative embodiments. In this context, the expert will also especially add individual aspects as improvements or additions to the respective basic form of the present invention.

BRIEF DESCRIPTION OF THE DRAWINGS

In the text which follows, the invention will be explained in greater detail with reference to illustrative embodiments, referring to the attached figures of the drawing in which.

In the figures, the same reference symbols designate identical or functionally identical components unless something to the contrary is specified.

DETAILED DESCRIPTION OF THE PREFERRED EMBODIMENTS

Figure 1:
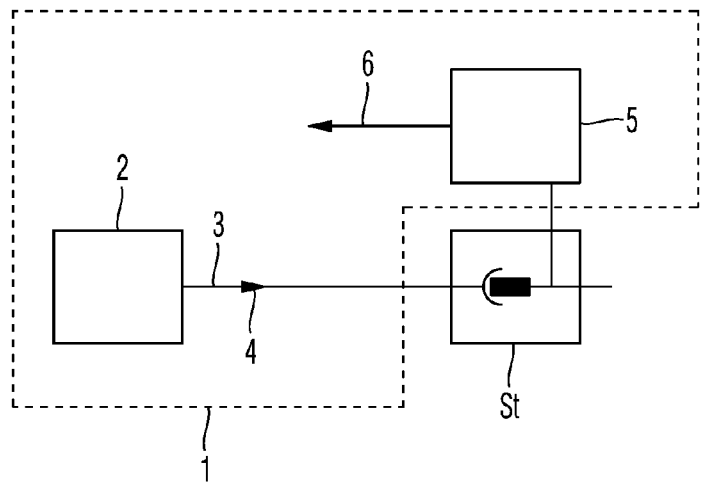
FIG. 1 shows a block diagram of an embodiment of a test system according to the invention.

FIG. 1 shows a block diagram of an embodiment of a test system 1 according to the invention.

The test system 1 in FIG. 1 has a transmitting device 2 which is coupled with a plug-in connector St via an electrical cable 3. Furthermore, the test system 1 has a receiving device 5 which is also coupled with the plug-in connector St. In this context, the connecting elements of the plug-in connector St are electrically located between the transmitting device 2 and the receiving device 5.

The transmitting device 2 is constructed as first microcontroller 2 and is also constructed for sending out a predetermined test signal 4 via the electrical cable 3. The receiving device 5 is constructed as second microcontroller 5 and is constructed for monitoring the arrival of the test signal at the plug-in connector St and, on arrival of the test signal at the plug-in connector St, outputting a predetermined acknowledgement signal 6.

In FIG. 1, both the transmitting device 2 and the receiving device 5 are supplied with electrical energy by batteries, not shown. In further embodiments, the transmitting device 2 and/or the receiving device 5 can also be supplied with electrical energy via the lines of the electrical cable 3.

In further embodiments, the test system 1 has a plurality of receiving devices 5 which are in each case coupled with a plug-in connector St. In further embodiments, the test system 1 has at least two transmitting devices 2 which are in each case coupled with different segments of a cabling system.

In a further embodiment, the transmitting device 2 does not convey the test signal 4 via the electrical cable but conveys the test signal 4 via an RFID connection or another type of wireless communication link. In addition or as an alternative, the receiving device 5 conveys in one embodiment the acknowledgement signal 6 via an RFID connection or another type of wireless communication link.

Figure 2:
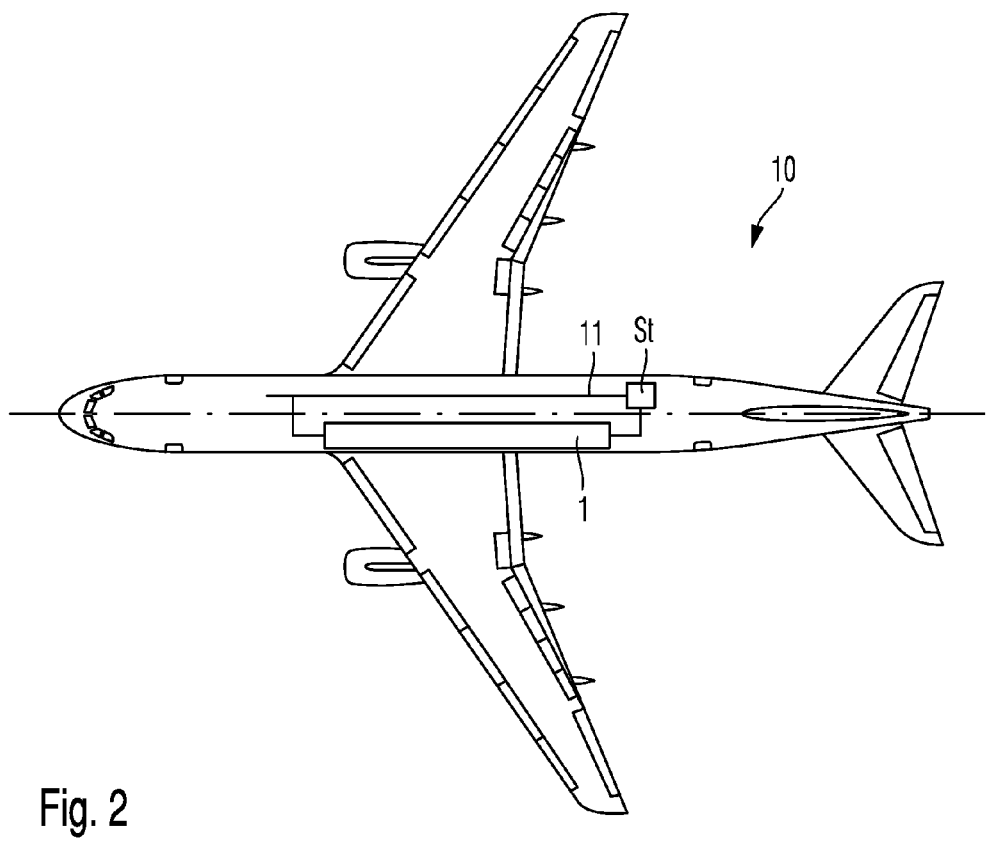
FIG. 2 shows a block diagram of an embodiment of an aircraft or spacecraft according to the invention.

FIG. 2 shows a block diagram of an embodiment of an aircraft or spacecraft 10 according to the invention.

The aircraft or spacecraft 10 in FIG. 2 is constructed as an airplane 10 and has an airplane cabling system 11 which has at least one plug-in connector St. Furthermore, the airplane 11 has a test system 1 according to the invention which is coupled with the airplane cabling system 11 and the plug-in connector St.

Figure 3:
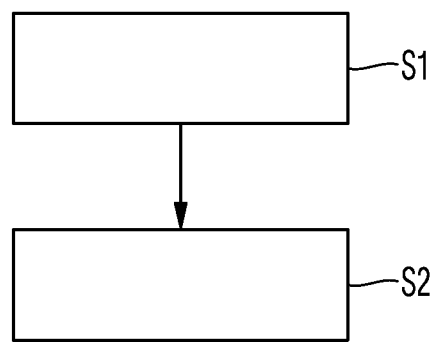
FIG. 3 shows a flow chart of an embodiment of a method according to the invention.

FIG. 3 shows a flow chart of an embodiment of a method according to the invention.

In a first step S1 of the method, a predetermined test signal 4 is sent out by means of a transmitting device 2 which is coupled with a plug-in connector St, St-1-St-n to be tested, via an electrical cable 3. In a second step S2 a predetermined acknowledgement signal 6 is output by the respective receiving device 5 in response to the reception of the test signal 4 at a receiving device 5, the receiving device 5 also being electrically coupled with the plug-in connector St, St-1-St-n to be tested.

Figure 4:
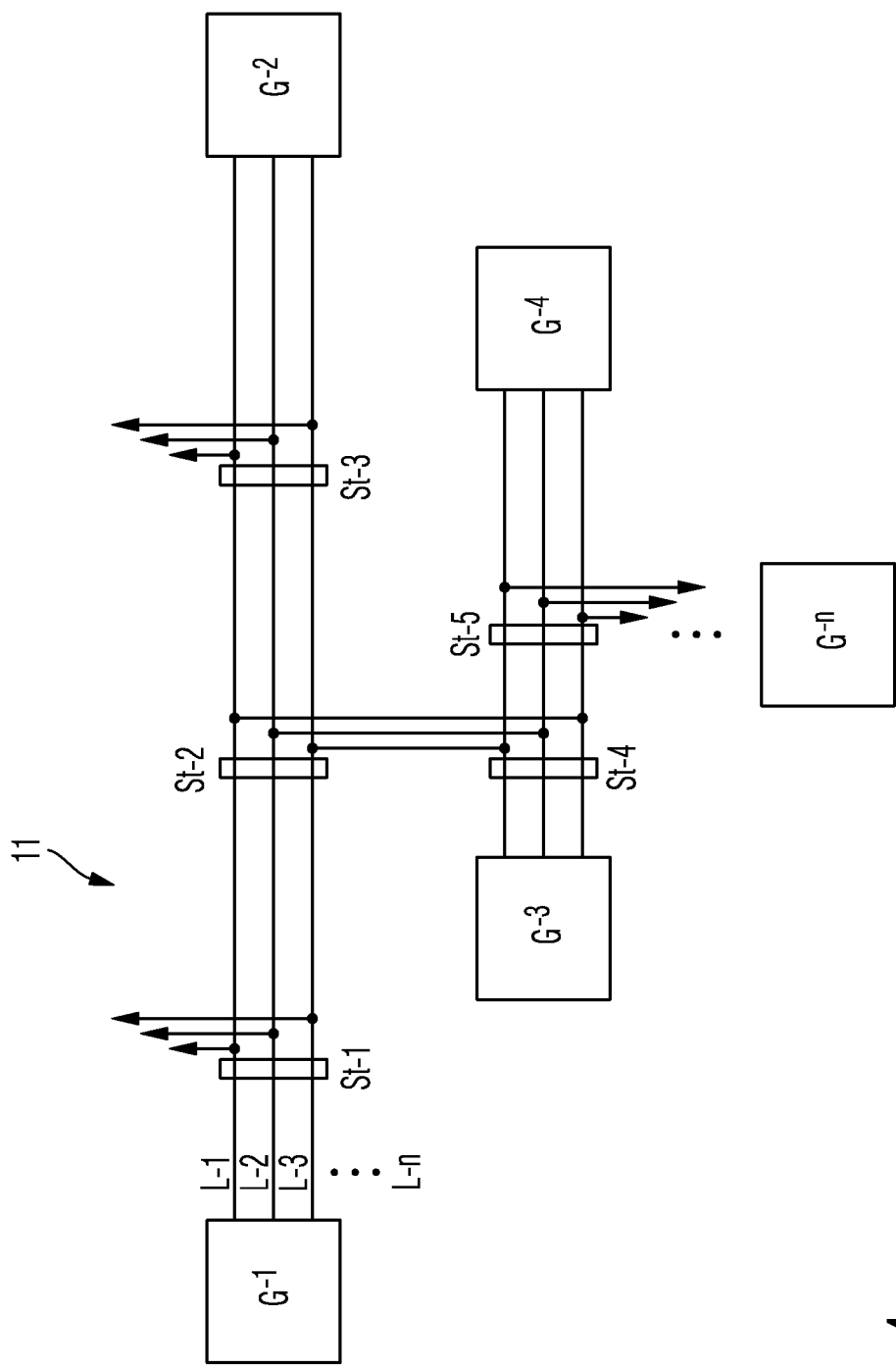
FIG. 4 shows a block diagram of an embodiment of a cabling system.

FIG. 4 shows a block diagram of one embodiment of a cabling system.

The cabling system in FIG. 4 is, for example, an airplane cabling system 11. The airplane cabling system 11 has a plurality of electronic devices G-1-G-n, only 4 electronic devices G-1-G-4 being shown in FIG. 4 and other electronic devices G-1-G-n being indicated by an electronic device designated by G-n.

The electrical cable 3 which connects the individual electronic devices G-1-G-n with one another is not shown as a single electrical cable 3. Instead, the electrical cable 3 is shown as a plurality of lines L-1-L-n. In this context, only three lines L-1-L-3 are again shown and other lines L-1-L-n are indicated by the reference symbol L-n.

The electrical cable 3 has a plurality of plug-in connectors St-1-St-5. In this context, three plug-in connectors St-1-St-3 are located between the first electronic device G-1 and the second electronic device G-2. Between the second plug-in connector St-2 and the third plug-in connector St-3, a line L-1-L-n branches away from each line, which connects the lines L-1-L-n in each case to the corresponding line L-1-L-n of an electrical cable which couples the electronic devices G-3 and G-4 with one another. Between the electronic devices G-3 and G-4 two further plug-in connectors St-4 and St-5, are located between which the connections to the lines L-1-L-n are linked between the first two electronic devices G-1 and G-2. Connections to further lines L-1-L-n are indicated by arrows which go out from lines L-1-L-n at the first plug-in connector St-1, the third plug-in connector St-3 and the fifth plug-in connector St-5.

In FIG. 4 it becomes clear that a cabling system, particularly an airplane cabling system 11, very rapidly attains high complexity. A plurality of points exist in the cabling system even with few devices G-1-G-n and plug-in connectors St-1-St-n, which can or must be checked during maintenance e.g. of an airplane.

The number of possible signal paths and checking options increases with each plug-in connector St-1-St-n and each cross connection between individual segments of the cabling system.

If a test system 1 according to the invention is utilized, each of the plug-in connectors St-1-St-n can be coupled with a receiving device 5 according to the invention, e.g. when taking an airplane cabling system 11 into operation. For checking the airplane cabling system 11, it is then sufficient to couple the individual segments of the airplane cabling system 11 in each case with a transmitting device 2 and after sending the test signal 4 to poll the acknowledgement signals 6 of the individual receiving devices 5. In a further embodiment, the receiving devices 5 at the plug-in connectors St-1-St-n can also be retrofitted after the assembly of the airplane 10. In a further embodiment, each of the plugs has an integrated receiving device 5.

Figure 5:
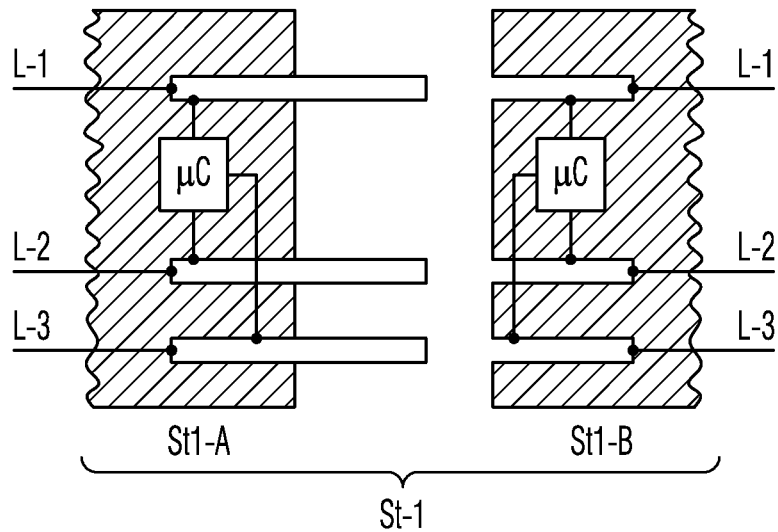
FIG. 5 shows a block diagram of an embodiment of a plug-in connector.

FIG. 5 shows a block diagram of one embodiment of a plug-in connector St-1.

The plug-in connector St-1 in FIG. 5 is a three-pin plug-in connector St-1 which has a plug St1-A and a socket St1-B. Both the plug St1-A and the socket St1-B have in each case a receiving device 6 in the form of a microcontroller µC. The microcontrollers µC are here coupled in each case with the three individual contacts of the plug St1-A and of the socket St1-B, respectively. This enables the microcontrollers µC to check all three contacts of the plug-in connector St-1.

Figure 6:
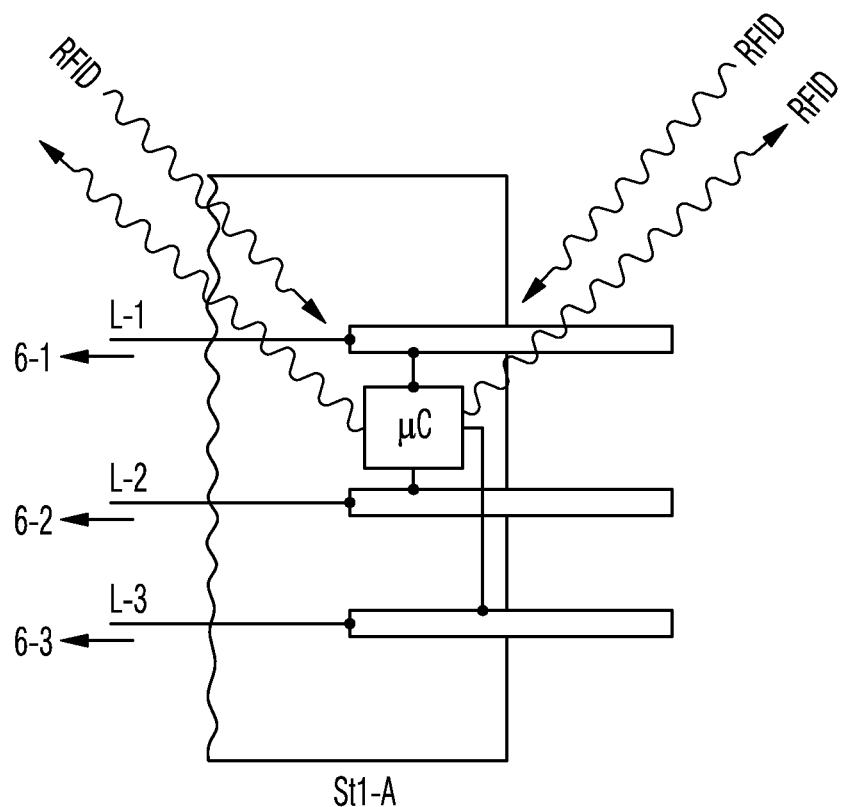
FIG. 6 shows a block diagram of an embodiment of a plug of a plug-in connector.

FIG. 6 shows a block diagram of one embodiment of a plug St1-A of a plug-in connector St-1.

The plug St1-A has three contacts which are coupled with in each case one line L-1-L-3 of an electrical cable 3 (not shown separately). FIG. 6 also shows a receiving device 5 in the form of a microcontroller µC which is coupled with each of the three lines L-1-L-3. Finally, radio waves RFID are shown which represent a radio link based on RFID technology to the microcontroller µC. The microcontroller µC in FIG. 6 receives a test signal 4 via the radio link and conveys on each of the three lines L-1-L-3 an acknowledgement signal 6-1-6-3. In a further embodiment, the microcontroller µC receives a test signal 4 via each of the three lines L-1-L-3 and conveys an acknowledgement signal 6-1-6-3 via the radio link.

Figure 7:
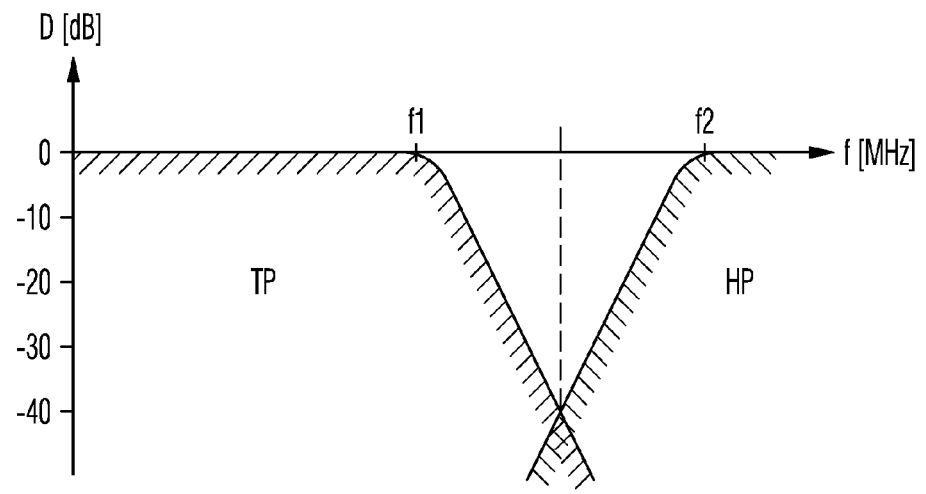
FIG. 7 shows a diagram with a frequency characteristic of a useful signal and a frequency characteristic of an embodiment of a test signal or acknowledgement signal.

FIG. 7 shows a diagram with a frequency characteristic TP of a useful signal and a frequency characteristic HP of an embodiment of a test signal 4 and of an acknowledgement signal 6, respectively.

In the diagram in FIG. 7, the attenuation D in decibels is shown along the ordinate axis. In this context, the ordinate axis begins at the top in the diagram at 0 dB attenuation. In the negative range of the ordinate axis, the attenuation values −10 dB, −20 dB, −30 dB and −40 dB are drawn. Along the abscissa axis of the diagram, the frequency is drawn in MHz. The diagram in FIG. 7 also has two curves. The first curve represents the frequency band of the useful signal which is transmitted e.g., via an airplane cabling system 11.

In this context, the first curve extends from the origin of the coordinate system of the diagram at an attenuation of 0 dB up to a first frequency f1. Beginning at the first frequency f1, the first curve drops with a uniform negative gradient. This frequency characteristic corresponds to the frequency characteristic of a low-pass filter and, at the same time, represents the frequency band of the useful signal.

The second curve intersects the first curve at an attenuation of approx. −40 dB and rises with a constant positive gradient up to a second frequency f2. From the second frequency f2 onward, the second curve extends at an attenuation of 0 dB. In further embodiments, other frequency characteristics are possible.

In the diagram in FIG. 7 it becomes clear how the suitable choice of the frequency band of the useful signal and of the test signal 3 and of the acknowledgement signals 6, respectively, enables these signals to be separated. As a result, it becomes possible to carry out a test of plug-in connectors St, St-1-St-n also during the operation, e.g., of an airplane cabling system.

If a single frequency band is defined in which the test signal 4 and the acknowledgement signals 6 are conveyed, only one signal can always be transmitted at the same time. In order to test a plurality of plug-in connectors St, St-1-St-n, these must therefore be polled one after the other.

Figure 8:
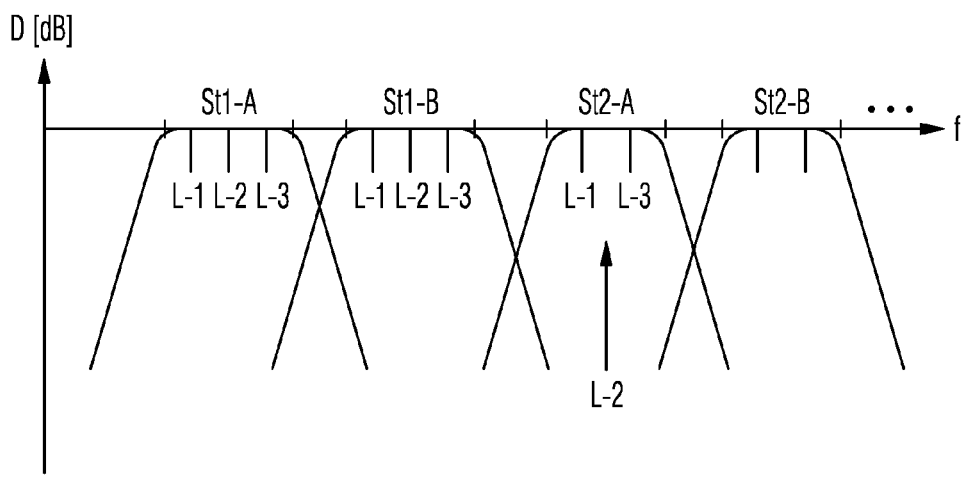
FIG. 8 shows a diagram with frequency characteristics of a number of embodiments of test signals or acknowledgement signals.

FIG. 8 shows a diagram with frequency characteristics of a number of embodiments of test signals 3 and acknowledgement signals 6, respectively.

In the diagram in FIG. 8, the ordinate axis shows an attenuation D in dB and the abscissa axis shows the frequency f in MHz, as in FIG. 7.

In contrast to the diagram in FIG. 7, however, the diagram in FIG. 8 shows a section of the frequency band in which the second curve FIG. 7 already has an attenuation of 0 dB.

The diagram in FIG. 8 illustrates how the frequency band for the test signal 4 and the acknowledgement signals 6 can be further subdivided so that a plurality of plug-in connectors St, St-1-St-n can be simultaneously tested.

In the diagram in FIG. 8, four curves are shown. Further curves are shown by three dots. The four curves have in each case a plateau at which the individual curves have an attenuation of 0 dB. To the right and to the left of this plateau, the curves in each case drop steeply. The individual curves are displaced with respect to one another in such a manner that the plateaus of the individual curves do not over-lap and a predeterminable space is located between the individual plateaus. The first curve stands for a plug St1-A of a plug-in connector St-1. The second curve stands for a socket St1-B of a plug-in connector St-1. The third curve stands for a plug St2-A of a plug-in connector St-2. The fourth curve stands for a socket St2-B of a plug-in connector St-2.

In the first two of the four plateaus, three acknowledgement signals 6 are in each case indicated, the frequencies of the individual acknowledgement signals 6 being uniformly distributed in the respective plateau. In the third and fourth plateau only the right-hand and left-hand acknowledgement signal 6 are in each case indicated. In this context, the first acknowledgement signal 6 in each plateau stands for a first line L-1 of an electrical cable 3, the second acknowledgement signal 6 stands for a second line L-2 of an electrical cable 3 and the third acknowledgement signal 6 stands for a third line L-3 of an electrical cable 3.

From the diagram, it can be seen that in plateaus of the third and fourth curve, the centre acknowledgement signal 6 which stands for the second line L-2 of an electrical cable 4, is not transmitted. In consequence, it can be concluded from the diagram that at least the contact of the second line L-2 of the plug-in connector St-2 is defective and must be repaired or replaced.

It can also be seen that with a suitable choice of the frequencies of the individual acknowledgement signals 6, a plurality of acknowledgement signals 6 can be simultaneously transmitted.

Although the present invention has been described above by means of preferred illustrative embodiments, it is not restricted to these but can be modified in various ways. It should be understood that I wish to embody within the scope of the patent warranted hereon all such modifications as reasonably and properly come within the scope of my contribution to the art.

LIST OF REFERENCE SIGNS

1 Test system
2 Transmitting device
3 Electrical cable
4, 4-1-4-3 Test signal
5 Receiving device
6 Acknowledgement signal
10 Airplane
11 Airplane cabling system
D Attenuation
f Frequency
G-1-G-n Electronic devices
L-1-L-n Electrical lines
St, St-1-St-2 Plug-in connectors
St1-A, St2-A Plugs
St1-B, St2-B Sockets
TP, HP Frequency bands)
μC Microcontroller
S1-S2 Method steps

The invention claimed is:

1. A test system for testing a plug-in connector in an airplane or a spacecraft with a cabling system connected to the plug-in connector having a plug and a socket, the test system comprising:
a transmitting device having a first microcontroller configured to transmit at least one predetermined test signal via a wireless connection for testing an electrical connection associated with the plug-in connector;
at least one receiving device having a second microcontroller for monitoring an arrival of the transmitted test signal at the plug-in connector for testing the plug-in connector, which is electrically coupled with the plug-in connector and which is designed for receiving the transmitted test signal and outputting at least one predetermined acknowledgement signal via the wireless connection for identifying the electrical connection of the plug-in connector in response to receiving the transmitted test signal;
wherein the plug-in connector is addressed directly and data for the plug-in connector is alpha numeric, and the plug-in connector itself can be addressed by an unambiguous code which can be formed from a plug type.

2. The test system according to claim 1, wherein at least one of the transmitting device and the at least one receiving device are supplied with electrical energy via an electrical cable.

3. The test system according to claim 2, wherein the electrical cable is arranged for transmitting at least one of the predetermined test signal for the plug-in connector by the transmitting device and the predetermined acknowledgement signal by the at least one receiving device.

4. The test system according to claim 1, wherein a wireless interface is arranged for supplying at least one of the transmitting device and the at least one receiving device with electrical energy.

5. The test system according to claim 4, wherein the wireless interface is arranged for transmitting at least one of the predetermined test signal for the plug-in connector to be tested by the transmitting device and the predetermined acknowledgement signal by the receiving device.

6. The test system according to claim 1, wherein the transmitting device is coupled with the plug-in connector to be tested via an electrical cable; and wherein the receiving device is coupled with the plug-in connector in such a manner that connecting elements of the plug-in connector are electrically arranged between the transmitting device and the at least one receiving device.

7. The test system according to claim 2, wherein at least one of the transmitted test signal and the acknowledgement signal has at least one of a frequency spectrum and a type of modulation which are designed in such a manner that at least one of a data transmission and power transmission via the electrical cable is not disturbed by either the transmitted test signal and the acknowledgement signal.

8. The test system according to claim 1, wherein at least one of the transmitted test signal and the acknowledgement signal of the receiving device in each case have one of a different frequency spectrum and a different modulation.

9. An aircraft or spacecraft, comprising:
an airplane cabling system having at least one plug-in connector having a plug and a socket;
a test system for the at least one plug-in connector, the test system including:
a transmitting device having a first microcontroller configured for sending out at least one predetermined test signal via a wireless connection for testing an electrical connection associated with the at least one plug-in connector, and
at least one receiving device having a second microcontroller for monitoring an arrival of the transmitted test signal at the at least one plug-in connector for testing the at least one plug-in connector, which is electrically coupled with the respective plug-in connector and which is designed for receiving the transmitted test signal and outputting at least one predetermined acknowledgement signal via the wireless connection for identifying the electrical connection of the at least one plug-in connector in response to receiving the transmitted test signal,
wherein the plug-in connector is addressed directly and data for the plug-in connector is alpha numeric, and the plug-in connector itself can be addressed by an unambiguous code which can be formed from a plug type.

10. A test method for testing a plug-in connector in an airplane or a spacecraft using a cabling system connected to the plug-in connector having a plug and a socket, the test method comprising:
transmitting at least one predetermined test signal via a wireless connection for testing an electrical connection associated with the plug-in connector via a transmitting device having a first microcontroller;
electrically coupling at least one receiving device having a second microcontroller with the plug-in connector for receiving the transmitted test signal and monitoring an arrival of the transmitted test signal at the plug-in connector;

outputting at least one predetermined acknowledgement signal via the wireless connection for identifying the electrical connection of the plug-in connector in response to receiving the transmitted test signal; and wherein the plug-in connector is addressed directly and data for the plug-in connector is alpha numeric, and the plug-in connector itself can be addressed by an unambiguous code which can be formed from a plug type.

11. The test method according to claim 10, comprising the further step:

supplying at least one of the transmitting device and the at least one receiving device with electrical energy via an electrical cable.

12. The test method according to claim 11, comprising the further step of using the electrical cable for at least one of:

sending the at least one predetermined test signal to the plug-in connector to be tested; and outputting the at least one predetermined acknowledgement signal.

13. The test method according to claim 10, comprising the further step:

supplying at least one of the transmitting device and the at least one receiving device with electrical energy via a wireless interface.

14. The test method according to claim 13, comprising the further step of using the wireless interface for at least one of:

sending the at least one predetermined test signal to the plug-in connector to be tested; and outputting the at least one predetermined acknowledgement signal.

15. The test method according to claim 10, wherein at least one of the transmitted test signal and the at least one acknowledgement signal have at least one of a frequency spectrum and a type of modulation which are designed in such a manner that at least one of a data transmission and a power transmission via the electrical cable is not disturbed by either of the transmitted test signal and the acknowledgement signal.

* * * * *